United States Patent
Yufu

(10) Patent No.: US 10,651,580 B2
(45) Date of Patent: May 12, 2020

(54) CIRCUIT BOARD CONNECTING DEVICE

(71) Applicant: DAI-ICHI SEIKO CO., LTD., Kyoto (JP)

(72) Inventor: Kenji Yufu, Tokyo (JP)

(73) Assignee: DAI-ICHI SEIKO CO., LTD., Kyoto (JP)

( * ) Notice: Subject to any disclaimer, the term of this patent is extended or adjusted under 35 U.S.C. 154(b) by 0 days.

(21) Appl. No.: 16/402,807

(22) Filed: May 3, 2019

(65) Prior Publication Data

US 2019/0348781 A1 Nov. 14, 2019

(30) Foreign Application Priority Data

May 10, 2018 (JP) .................................. 2018-091723

(51) Int. Cl.
*H01R 12/52* (2011.01)
*H01R 12/71* (2011.01)
(Continued)

(52) U.S. Cl.
CPC ........... *H01R 12/716* (2013.01); *H01R 12/52* (2013.01); *H01R 13/426* (2013.01); *H05K 1/144* (2013.01);
(Continued)

(58) Field of Classification Search
CPC .... H01R 12/52; H01R 12/716; H01R 12/526; H01R 12/707; H01R 43/0256
(Continued)

(56) References Cited

U.S. PATENT DOCUMENTS 7,207,842 B1 * 4/2007 Kenjo .................. H01R 9/0515
439/607.01
8,961,215 B2 * 2/2015 Hasegawa ............ H01R 12/716
439/346
(Continued)

FOREIGN PATENT DOCUMENTS

| CN | 106935995 A | 7/2017 |
| JP | 2015-230840 A | 12/2015 |
| WO | 2016/178356 A1 | 11/2016 |

OTHER PUBLICATIONS

An Office Action mailed by the Japanese Patent Office dated Mar. 10, 2020, which corresponds to Japanese Patent Application No. 2018-091723 and is related to U.S. Appl. No. 16/402,807.

*Primary Examiner* — Hien D Vu
(74) *Attorney, Agent, or Firm* — Studebaker & Brackett PC

(57) ABSTRACT

A circuit board connecting device comprising an insulating housing, a plurality of conductive contacts arranged on the insulating housing, and a resilient shell member attached to the insulating housing, wherein the resilient shell member includes a strip-shaped portion surrounding partially a board-facing surface portion of the insulating housing so as to cause an inner surface portion thereof to come into resilient contact with an outer surface portion of a mate connecting device, a pair of bent projecting portions each elongating to be bent from an end portion of the strip-shaped portion for projecting in a direction remote from the insulating housing, and a pair of extending portions each extending further to be bent from an end portion of the bent projecting portion so as to be opposite to the strip-shaped portion, so that the whole of the strip-shaped portion, the bent projecting portions and the extending portions constitute a spring member.

8 Claims, 7 Drawing Sheets

(51) Int. Cl.
   *H05K 1/14*      (2006.01)
   *H01R 13/426*    (2006.01)
   *H05K 1/18*      (2006.01)

(52) U.S. Cl.
   CPC ... *H05K 1/181* (2013.01); *H05K 2201/10189* (2013.01)

(58) Field of Classification Search
   USPC .......................................................... 439/74
   See application file for complete search history.

(56) References Cited

U.S. PATENT DOCUMENTS

2006/0063432 A1* 3/2006 Chen .................. H01R 13/658
                                                439/607.36
2015/0064942 A1* 3/2015 Takemoto ............ H01R 13/639
                                                439/74

* cited by examiner

CIRCUIT BOARD CONNECTING DEVICE

BACKGROUND OF THE INVENTION

Field of the Invention

The present invention relates generally to a circuit board connecting device, and more particularly to an improvement in a circuit board connecting device which is mounted on one of a couple of separate circuit boards to be coupled with a mate connecting device mounted on the other of the separate circuit boards for putting first and second groups of circuit terminals provided respectively on the separate circuit boards in mutual electrical connection so that the separate circuit boards are electrically connected with each other under a condition wherein one of the separate circuit boards is closely laid on top of the other of the separate circuit boards.

Description of the Prior Art Including Information Disclosed Under 37 CFR 1.97 and 37 CFR 1.98

Various kinds of electric or electronic parts are built even in a relatively small-sized electronic apparatus such as a mobile phone, a wearable device or the like. A major part of those parts are dispersedly mounted on, for example, a couple of separate circuit boards to fulfill their respective functions. A solid printed circuit board or a flexible printed circuit board (FPC) may be used as each of the separate circuit boards. In the relatively small-sized electronic apparatus, having an eye to the couple of separate circuit boards on which the electric or electronic parts are mounted, it is likely that one of the separate circuit boards is required to be closely laid on top of the other of the separate circuit boards for reducing a space occupied thereby when the separate circuit boards are electrically connected with each other. Such electrical connection between the separate circuit boards wherein one is closely laid on top of the other is hereinafter referred to as electrical piled-up connection.

In general, when a plurality of separate circuit boards, such as solid printed circuit boards or flexible printed circuit boards, are electrically connected with one another, a plurality of electrical connectors are mounted on the separate circuit boards, respectively, and one of the electrical connectors is coupled with another electrical connector so as to connect one of the separate circuit boards electrically with another separate circuit board. In case of the electrical piled-up connection mentioned above, first and second electrical connectors are mounted respectively on the separate circuit boards to be coupled with each other. The first electrical connector is formed into a plug type connector and the second electrical connector is formed into a receptacle type connector to be a mate electrical connector for the first electrical connector, so that the plug type connector is coupled with the receptacle type connector when the separate circuit boards are put in a condition of the electrical piled-up connection.

Under such a situation, there have been previously proposed several circuit board connecting devices, each of which is used for putting a couple of separate circuit boards in the electrical piled-up connection, as disclosed in, for example, the PCT International Publication No. WO 2016/178356 A1 (hereinafter, referred to as published prior art document).

A circuit board connecting device disclosed in the published prior art document mentioned above comprises an electrical connector (a multipolar connector (10)) which has an insulating housing (an insulating member (16)), a plurality of conductive contacts (inner terminals (14a to 14c)) provided on the insulating housing and a resilient shell member (an external terminal (12)) made of metal plate material subjected to bending processing and fixed to the insulating housing so as to surround partially the same. Such a previously proposed electrical connector (the multipolar connector (10)) is to be mounted on a first circuit board.

In the electrical connector (the multipolar connector (10)) thus proposed, the resilient shell member is provided with an outer frame portion (20) having a build portion (21) formed into a belt-like shape to be arranged around the insulating housing and a plurality of guiding portions (22a to 22d) provided respectively on corners of the build portion (21), a couple of bent portions (24a, 24b) provided on the build portion (21), and a plurality of connecting portions (26a to 26c) provided also on the build portion (21). The guiding portions (22a to 22d) are formed respectively into a plurality of protrusions (P1 to P4) each projecting toward the inside of the build portion (21).

When the electrical connector (the multipolar connector (10)) constituted as described above is mounted on the first circuit board, the bent portions (24a, 24b) and the connecting portions (26a to 26c) provided on the build portion (21) of the outer frame portion (20) are connected to connecting land terminals provided on a parts-mounting surface of the first circuit board by means of soldering, so that the electrical connector (the multipolar connector (10)) is fixed to the first circuit board. In the electrical connector (the multipolar connector (10)) fixed to the first circuit board, the conductive contacts are connected respectively to separate connecting terminals provided on the parts-mounting surface of the first circuit board.

The electrical connector (the multipolar connector (10)) mounted on the first circuit board in such a manner as mentioned above is caused to be coupled with a mate electrical connector (a mate connector (50)) mounted on a second circuit board. The mate electrical connector comprises a mate insulating housing (an insulating member (66)), a plurality of mate conductive contacts (inner terminals (64a to 64c)) provided on the mate insulating housing and a mate resilient shell member (an external terminal (52)) made of metal plate material subjected to bending processing and fixed to the mate insulating housing so as to surround partially the same. In the mate electrical connector thus proposed, the mate resilient shell member is provided with a bottom portion (54) to be fixed on a parts-mounting surface of the second circuit board and an inner frame portion (56) formed into a belt-like shape to be arranged for surrounding the mate insulating housing so as to be connected with the electrical connector mounted on the first circuit board. A plurality of recesses (Q1 to Q4) are provided respectively on corners of the inner frame portion (56) of the mate resilient shell member. Then, under a condition wherein the bottom portion (54) of the mate resilient shell member is fixed on the parts-mounting surface of the second circuit board so that the mate electrical connector is fixed to the second circuit board, the mate conductive contacts are connected respectively to separate connecting terminals provided on the parts-mounting surface of the second circuit board.

When the electrical connector (the multipolar connector (10)) mounted on the first circuit board is put in a condition to be coupled with the mate electrical connector mounted on the second circuit board, the build portion (21) of the outer frame portion (20) constituting the resilient shell member of the electrical connector (the multipolar connector (10)) is put in resilient engagement with the inner frame portion (56) of the mate resilient shell member of the mate electrical connector in such a manner that an inside surface of the build portion (21) is caused to come into contact with an outer surface of the inner frame portion (56). Under a condition wherein the build portion (21) of the outer frame portion (20) is resiliently engaged with the inner frame portion (56), the protrusions (P1 to P4) which the guiding portions (22a to 22d) form respectively to be provided on the outer frame portion (20) to project toward the inside of the build portion (21), are put in engagement respectively with the recesses (Q1 to Q4) provided on the inner frame portion (56), so that the build portion (21) of the outer frame portion (20) is locked up to the inner frame portion (56). This results in that it can be expected that the electrical connector (the multipolar connector (10)) is stably maintained in coupling with the mate electrical connector. Further, in such a condition as mentioned above, each of the conductive contacts provided on the insulating housing of the electrical connector (the multipolar connector (10)) comes into contact with a corresponding one of the mate conductive contacts provided on the mate insulating housing of the mate electrical connector, so that the first circuit board on which the electrical connector (the multipolar connector (10)) is mounted and the second circuit board on which the mate electrical connector is mounted are put in a condition of the electrical piled-up connection.

In the previously proposed electrical connector (the multipolar connector (10)) used for putting the first and second circuit boards in the electrical piled-up connection as disclosed in the published prior art document mentioned above, there are the following defects or disadvantages.

It is usual that the electrical connector (the multipolar connector (10)) mounted on the first circuit board is required to be subjected to effective reduction in thickness in a direction perpendicular to the parts-mounting surface of the first circuit board for achieving low-profile. Along with the reduction in thickness of the electrical connector (the multipolar connector (10)), the build portion (21) of the outer frame portion (20) is also reduced in a size in the direction perpendicular to the parts-mounting surface of the first circuit board (hereinafter, referred to as a vertical dimension).

Under such a situation, when the electrical contact (the multipolar connector (10)) is put in coupling with the mate electrical connector, the build portion (21) of the outer frame portion (20) constituting the resilient shell member of the electrical connector (the multipolar connector (10)) is put in resilient engagement with the inner frame portion (56) of the mate resilient shell member of the mate electrical connector in the manner that the inside surface of the build portion (21) is caused to come into contact with the outer surface of the inner frame portion (56) and the protrusions (P1 to P4) provided on the outer frame portion (20) to project toward the inside of the build portion (21) are put in engagement respectively with the recesses (Q1 to Q4) provided on the inner frame portion (56), so that that the electrical connector (the multipolar connector (10)) is maintained in coupling with the mate electrical connector. When the protrusions (P1 to P4) are caused to engage respectively with the recesses (Q1 to Q4), each of the protrusions (P1 to P4) gets over a peripheral portion of a corresponding one of the recesses (Q1 to Q4) so as to be put in the corresponding one of the recesses (Q1 to Q4). Therefore, when the build portion (21) of the outer frame portion (20) is caused to be resiliently engaged with the inner frame portion (56) of the mate resilient shell member of the mate electrical connector and accordingly each of the protrusions (P1 to P4) gets over the peripheral portion of the corresponding one of the recesses (Q1 to Q4) so as to be put in the corresponding one of the recesses (Q1 to Q4), the build portion (21) is once subjected to deformation caused by contact-pressure acting on each of the protrusions (P1 to P4) from the peripheral portion of the corresponding one of the recesses (Q1 to Q4) and then returns to the original with its own resilient restoring force. On that occasion, the reduction in the vertical dimension of the build portion (21) for achieving low-profile of the electrical connector (the multipolar connector (10)) and changes with time in the vertical dimension of the build portion (21) exert a bad influence on mutual engagements between the protrusions (P1 to P4) and the recesses (Q1 to Q4).

In more detail, since the outer frame portion (20) having the build portion (21) and the guiding portions (22a to 22d) forming respectively the protrusions (P1 to P4) constitutes the resilient shell member of the electrical connector (the multipolar connector (10)) and the resilient shell member is made of metal plate material subjected to bending processing, the build portion (21) of the outer frame portion (20) is also made of metal plate material subjected to bending processing. Therefore, it is hard for the build portion (21) of the outer frame portion (20) which is reduced in the vertical dimension for achieving low-profile of the electrical connector (the multipolar connector (10)) to have sufficient resiliency and further the changes with time on the build portion (21) of the outer frame portion (20) bring about lowering in the resilient restoring force of the build portion (21), so that it is fared that the mutual engagement between the protrusions (P1 to P4) provided on the outer frame portion (20) and the protrusions (P1 to P4) provided on the inner frame portion (56) of the mate resilient shell member is deteriorated.

Under a condition wherein the build portion (21) of the outer frame portion (20) has insufficient resiliency and the resilient restoring force of the build portion (21) is lowered, any sufficient restored state of the build portion (21) is cannot to obtained when the build portion (21) is once subjected to deformation caused by contact-pressure acting on each of the protrusions (P1 to P4) from the peripheral portion of the corresponding one of the recesses (Q1 to Q4) and then returns to the original with its own resilient restoring force, so that it is difficult for the build portion (21) to cause each of the protrusions (P1 to P4) to engage properly and surely with the corresponding one of the protrusions (P1 to P4). This results in that the build portion (21) of the outer frame portion (20) constituting the resilient shell member is not able to lock properly the inner frame portion (56) of the mate resilient shell member and thereby the electrical connector (the multipolar connector (10)) is not able to be properly and surely maintained in coupling with the mate electrical connector.

BRIEF SUMMARY OF THE INVENTION

Accordingly, it is an object of the present invention to provide a circuit board connecting device used for putting a couple of circuit boards in electrical piled-up connection, which is to be mounted on one of the circuit boards to be coupled with a mate connecting device mounted on the other of the circuit boards and provided with a resilient shell member for engaging resiliently with the mate connecting device when the circuit board connecting device is coupled with the mate connecting device so as to maintaining the circuit board connecting device in coupling with the mate connecting device, and which avoids the aforementioned problems and disadvantages encountered with the prior art.

Another object of the present invention is to provide a circuit board connecting device used for putting a couple of circuit boards in electrical piled-up connection, which is to be mounted on one of the circuit boards to be coupled with a mate connecting device mounted on the other of the circuit boards and provided with a resilient shell member for engaging resiliently with the mate connecting device when the circuit board connecting device is coupled with the mate connecting device so as to maintaining the circuit board connecting device in coupling with the mate connecting device, and in which the resilient shell member is able to keep sufficient resiliency even under a situation wherein the circuit board connecting device as a whole is subjected to reduction in its thickness for achieving low-profile, so that the circuit board connecting device is maintained properly and surely in coupling with the mate connecting device.

A further object of the present invention is to provide a circuit board connecting device used for putting a couple of circuit boards in electrical piled-up connection, which is to be mounted on one of the circuit boards to be coupled with a mate connecting device mounted on the other of the circuit boards and provided with a resilient shell member for engaging resiliently with the mate connecting device when the circuit board connecting device is coupled with the mate connecting device so as to maintaining the circuit board connecting device in coupling with the mate connecting device, and in which the resilient shell member is less susceptible to changes with time so as to be able to maintain properly and surely the circuit board connecting device in coupling with the mate connecting device.

According to the present invention, there is provided a circuit board connecting device used for putting a couple of circuit boards in electrical piled-up connection, which comprises an insulating housing shaped into a plate-like member having a board-facing surface portion for facing closely or contacting with a parts-mounting surface of a first circuit board, a plurality of conductive contacts arranged on the insulating housing, each of which is provided with a board connecting portion to be connected with the parts-mounting surface of the first circuit board and a contact-connecting portion operative to be put in contact with a mate conductive contact provided on a mate connecting device mounted on a second circuit board, and a resilient shell member attached to the insulating housing for engaging resiliently with the mate connecting device when the circuit board connecting device is coupled with the mate connecting device so as to maintaining the circuit board connecting device in coupling with the mate connecting device, wherein the resilient shell member includes a strip-shaped portion provided with a first fixing portion to be fixed to the parts-mounting surface of the first circuit board and surrounding partially the board-facing surface portion of the insulating housing so as to cause an inner surface portion thereof to come into resilient contact with an outer surface portion of the mate connecting device, a pair of bent projecting portions, each of which elongates to be bent from an end portion of the strip-shaped portion for projecting in a direction remote from the insulating housing, and a pair of extending portions, each of which is provided with a second fixing portion to be fixed to the parts-mounting surface of the first circuit board and extends further to be bent from an end portion of the bent projecting portion so as to be opposite to the strip-shaped portion. The whole of the strip-shaped portion between the first and second fixing portions, the bent projecting portions and the extending portions constitute a spring member.

In the circuit board connecting device thus constituted in accordance with the present invention, the resilient shell member which is attached to the insulating housing for engaging resiliently with the mate connecting device when the circuit board connecting device is coupled with the mate connecting device so as to maintaining the circuit board connecting device in coupling with the mate connecting device, comprises the strip-shaped portion provided with the first fixing portion and surrounding partially the board-facing surface portion of the insulating housing so as to cause the inner surface portion thereof to come into resilient contact with the outer surface portion of the mate connecting device, the bent projecting portions, each of which elongates to be bent from the end portion of the strip-shaped portion for projecting in the direction remote from the insulating housing, and the extending portions, each of which is provided with the second fixing portion and extends further to be bent from the end portion of the bent projecting portion so as to be opposite to the strip-shaped portion. Under such a condition, with the first and second fixing portions provided on the resilient shell member fixed to the first circuit board by means of, for example, soldering, the circuit board connecting device is mounted on the first circuit board with the board-facing surface portion of the insulating housing caused to face closely or contact with the parts-mounting surface of the first circuit board.

The circuit board connecting device mounted on the first circuit board is caused to be coupled with the mate connecting device mounted on the second circuit board and the contact-connecting portion of each of the conductive contacts each having the connecting portion connected with the parts-mounting surface of the first circuit board is contact-connected with the corresponding one of the mate conductive contacts connected with the second circuit board. As a result, the first circuit board on which the circuit board connecting device is mounted and the second circuit board on which the mate connecting device is mounted, are put in the electrical piled-up connection to be electrically connected with each other with the circuit board connecting device and the mate connecting device put between the first and second circuit boards.

When the circuit board connecting device according to the present invention is coupled with the mate connecting device in such a manner as described above, the strip-shaped portion of the resilient shell member surrounding partially the board-facing surface portion of the insulating housing causes the inner surface portion thereof to come into resilient contact with the outer surface portion of the mate connecting device, for example, an outer surface of a holding metal member for fixing the mate connecting device to the second circuit board, and thereby the circuit board connecting device is locked to the mate connecting device. This results in that the circuit board connecting device according to the present invention is properly and stably maintained in coupling with the mate connecting device.

With the circuit board connecting device according to the present invention, when the circuit board connecting device is coupled with the mate connecting device, the strip-shaped portion of the resilient shell member surrounding partially the board-facing surface portion of the insulating housing causes the inner surface portion thereof to come into resilient contact with the outer surface portion of the mate connecting device so as to lock the circuit board connecting device up to the mate connecting device. On that occasion, since the whole of the strip-shaped portion between the first and second fixing portions, the bent projecting portions and the extending portions constitute the spring member, a resilient pressing force by the spring member constituted with the whole of the strip-shaped portion between the first and second fixing portions, the bent projecting portions and the extending portions, acts on the strip-shaped portion so that the inner surface of the strip-shaped portion is caused to contact resiliently with the outer surface portion of the mate connecting device. In such a situation, the bent projecting portion elongating to be bent from the end portion of the strip-shaped portion for projecting in the direction remote from the insulating housing and the extending portion extending further to be bent from the end portion of the bent projecting portion so as to be opposite to the strip-shaped portion, are operative to enhance the resilient pressing force by the spring member acting on the strip-shaped portion.

In the circuit board connecting device according to the present invention which is provided with the resilient shell member thus constituted, the resilient shell member is able to keep sufficient resiliency even under the situation wherein the resilient shell member is reduced in its size in a direction perpendicular to the parts-mounting surface of the first circuit board along with a reduction in thickness of the circuit board connecting device as a whole for achieving low-profile, and in addition, is less susceptible to changes with time. Therefore, with the circuit board connecting device according to the present invention, the strip-shaped portion of the resilient shell member on which the resilient pressing force by the spring member constituted with the whole of the strip-shaped portion between the first and second fixing portions, the bent projecting portions and the extending portions is caused to act, is able to cause surely and stably the inner surface portion thereof to come into resilient contact with the outer surface portion of the mate connecting device even under the situation wherein the circuit board connecting device as a whole is subjected to reduction in its thickness for achieving low-profile, so that the circuit board connecting device is maintained properly and surely in coupling with the mate connecting device.

The above, and other objects, features and advantages of the present invention will become apparent from the following detailed description taken in conjunction with the accompanying drawings.

DETAILED DESCRIPTION OF THE INVENTION

Figure 1:
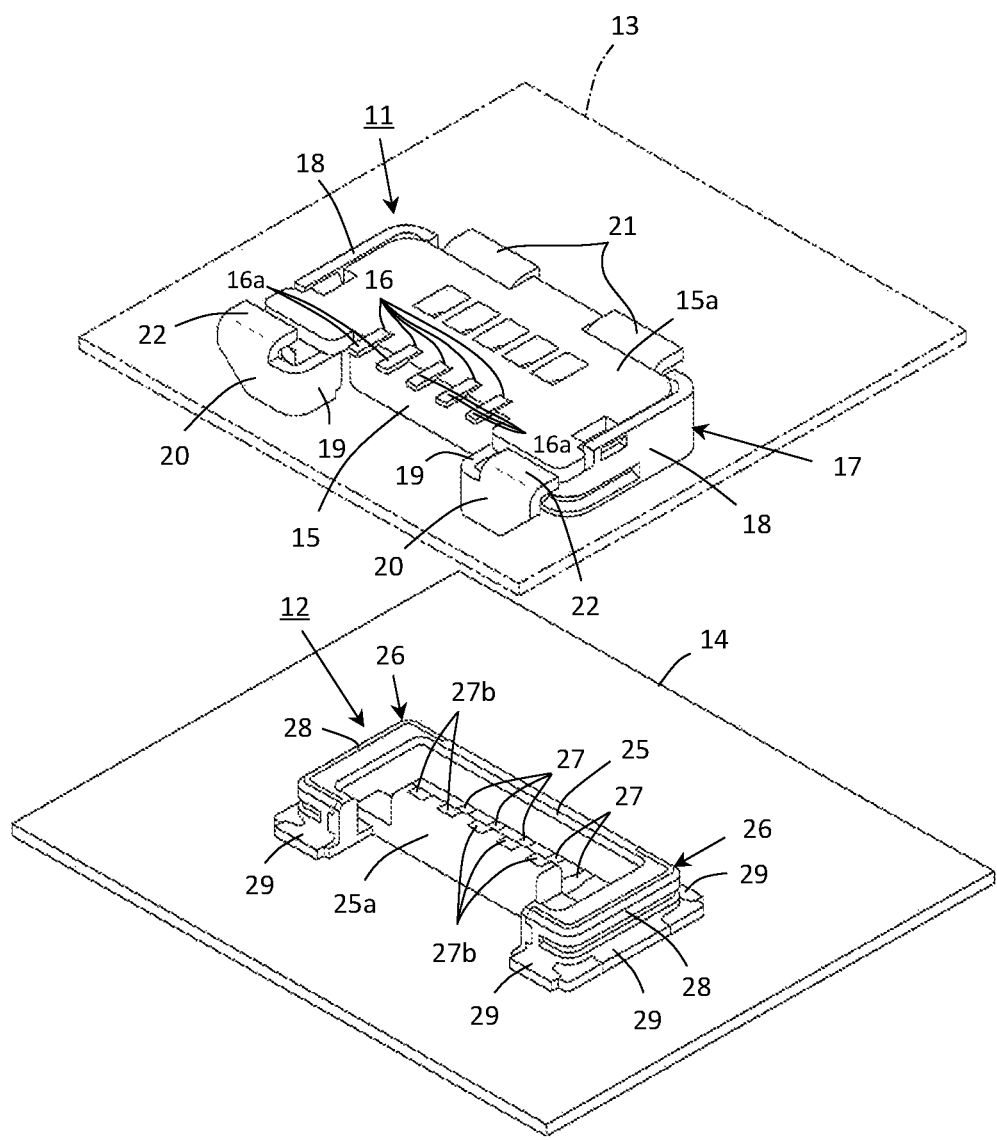
FIG. 1 is a schematic perspective view showing a first embodiment of circuit board connecting device according to the present invention which constitutes a plug connector, together with a first circuit board (shown by imaginary lines) on which the plug connector is mounted, and a mate connecting device which constitutes a receptacle connector and with which the plug connector is to be coupled, together with a second circuit board on which the receptacle connector is mounted.

FIG. 1 shows a plug connector 11 which is constituted with a first embodiment of circuit board connecting device according to the present invention and mounted on a circuit board 13 which constitutes a first circuit board and shown by imaginary lines (dot-dash lines), and a receptacle connector 12 which is constituted with a mate connecting device with which the plug connector 11 is to be coupled and mounted on a circuit board 14 which constitutes a second circuit board. The plug connector 11 is fixed to a parts-mounting surface facing downward (hereinafter, referred to as a lower surface) of the circuit board 13 and the receptacle connector 12 is fixed to a parts-mounting surface facing upward (hereinafter, referred to as an upper surface) of the circuit board 14.

Figure 2:
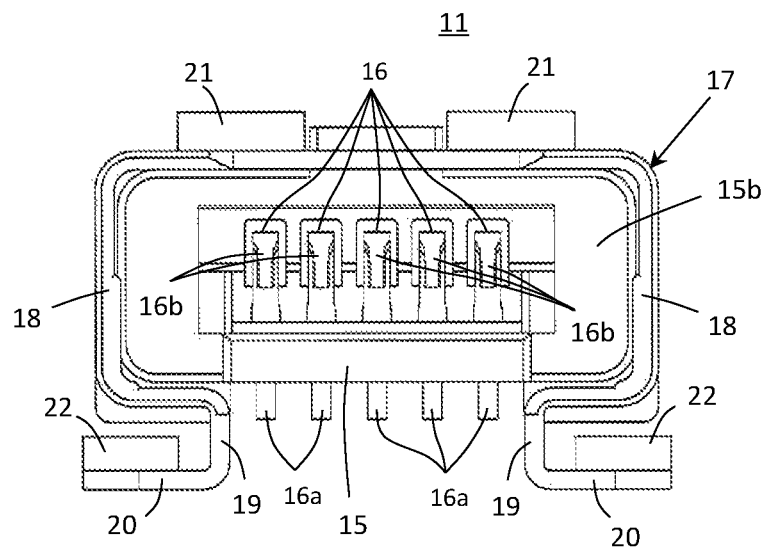
FIG. 2 is a schematic bottom view showing the plug connector shown in FIG. 1.

The plug connector 11 is provided with an insulating housing 15 made of insulator such as plastics or the like, as shown also in FIG. 2. The insulating housing 15 has a board-facing surface portion 15a for facing closely or contacting with the lower surface of the circuit board 13. A plurality of conductive contacts 16 are arranged on the insulating housing 15. Each of the conductive contacts 16 is made of resilient conductive plate material to be shaped into a strip and provided, respectively at both end portions of the stripe, with a board connecting portion 16a to be connected with a circuit terminal provided on the lower surface of the circuit board 13 and a contact-connecting portion 16b operative to be put in contact with a conductive contact provided on the receptacle connector 12 fixed to the upper surface of the circuit board 14. The board connecting portions 16a provided respectively on the conductive contacts 16 are arranged on the board-facing surface portion 15a of the insulating housing 15 for projecting from a side end of the board-facing surface portion 15a to the outside of the insulating housing 15 so as to be connected respectively with the circuit terminals provided on the lower surface of the circuit board 13 by means of, for example, soldering. The contact-connecting portions 16b provided respectively on the conductive contacts 16 are arranged on a bottom surface portion 15b opposite to the board-facing surface portion 15a of the insulating housing 15 for facing outside of the insulating housing 15.

Figure 3:
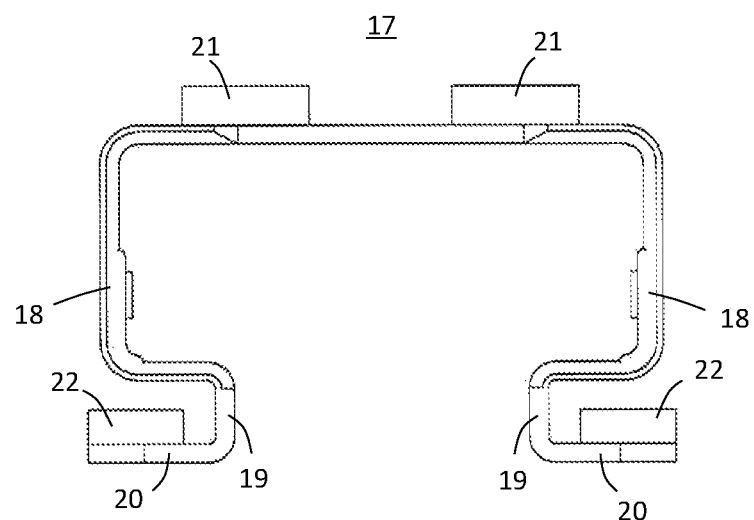
FIG. 3 is a schematic bottom view showing a resilient shell member provided to be employed in the plug connector shown in FIG. 1.

Further, a resilient shell member 17 is attached to the insulating housing 15 for engaging resiliently with the receptacle connector 12 when the plug connector 11 is coupled with the receptacle connector 12 so as to maintaining the plug connector 11 in coupling with the receptacle connector 12. As shown in FIG. 3, the resilient shell member 17 is made of resilient conductive plate material subjected to bending processing to include a strip-shaped portion 18 extending along the board-facing surface portion 15a of the insulating housing 15, a pair of bent projecting portions 19, each of which elongates to be bent from an end portion of the strip-shaped portion 18 for projecting in a direction remote from the insulating housing 15, and a pair of extending portions 20, each of which extends further to be bent from an end portion of the bent projecting portion 19 so as to be opposite to the strip-shaped portion 18.

The strip-shaped portion 18 is provided with a first fixing portion 21 to be fixed to the lower surface of the circuit board 13 and the extending portion 20 is provided with a second fixing portion 22 to be fixed to the lower surface of the circuit board 13. The whole of a part of the strip-shaped portion 18 between the first fixing portion 21 and the second fixing portion 22, the bent projecting portion 19 and the extending portion 20 constitutes a spring member. Under such a condition, the strip-shaped portion 18 is operative to cause an inner surface portion thereof to come into resilient contact with an outer surface portion of the receptacle connector 12 when the plug connector 11 is coupled with the receptacle connector 12.

In a more detailed explanation of the resilient shell member 17, the second fixing portion 22 provided on the extending portion 20 projects from the extending portion 20 so as to come close to the strip-shaped portion 18 in a space between the strip-shaped portion 18 and the extending portion 20 opposite to the strip-shaped portion 18. Since the space between the strip-shaped portion 18 and the extending portion 20 opposite to the strip-shaped portion 18 is effectively used for the second fixing portion 22 projecting from the extending portion 20 so as to come close to the strip-shaped portion 18 in such a manner as mentioned above, a projected area of the resilient shell member 17 on the lower surface of the circuit board 13 is reduced. The first fixing portion 21 provided on the strip-shaped portion 18 and the second fixing portion 22 provided on the extending portion 20 are arranged to face each other with the insulating housing 15 therebetween. The resilient shell member 17 constitutes a single member with the strip-shaped portion 18 surrounding partially the board-facing surface portion 15a of the insulating housing 15. Both ends of the strip-shaped portion 18 face each other with a predetermined space therebetween and the bent projecting portion 19 extends to be bent from each of the ends of the strip-shaped portion 18. The board connecting portion 16a of each of the conductive contacts 16 arranged on the insulating housing 15 projects from the insulating housing 15 to the outside thereof in the space between the both ends of the strip-shaped portion 18 facing each other.

Although, in the plug connector 11 shown in FIGS. 1 and 2, the resilient shell member 17 constitutes the single member with the strip-shaped portion 18 surrounding partially the board-facing surface portion 15a of the insulating housing 15, it is not necessary for the resilient shell member 17 to be limited to such an example. For example, it is also possible that the resilient shell member 17 constitutes first and second shell components attached to the insulating housing 15 and each of the first and second shell components is provided with a part of the strip-shaped portion 18, the bent projecting portion 19 and the extending portion 20. In such a case, the part of the strip-shaped portion 18 of the first shell component and the part of the strip-shaped portion 18 of the second shell component face each other with the board-facing surface portion 15a of the insulating housing 15 therebetween, the bent projecting portion 19 of the first shell component and the bent projecting portion 19 of the second shell component face each other with a predetermined space therebetween, and the extending portion 20 of the first shell component and the extending portion 20 of the second shell component face each other with a predetermined space therebetween. The board connecting portion 16a of each of the conductive contacts 16 arranged on the insulating housing 15 projects from the insulating housing 15 to the outside thereof in the space between the bent projecting portion 19 of the first shell component and the bent projecting portion 19 of the second shell component so as to be connected with the circuit terminal provided on the lower surface of the circuit board 13 be means of, for example, soldering.

Figure 4:
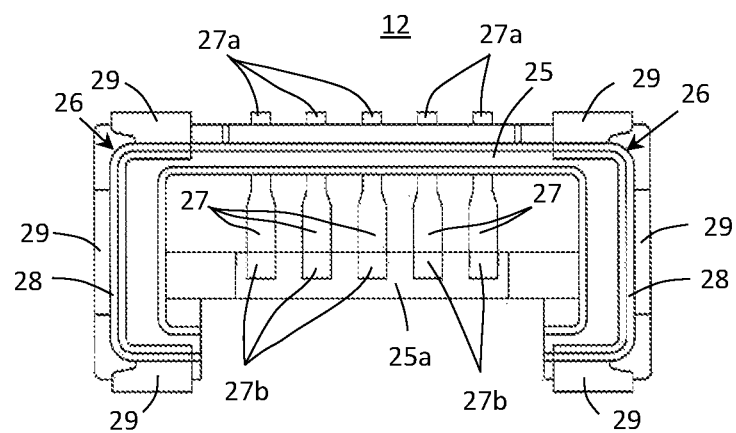
FIG. 4 is a schematic plan view showing the receptacle connector shown in FIG. 1.

The receptacle connector 12 is provided with an insulating housing 25 made of insulator such as plastics or the like and a pair of holding metal members 26 fixed to the insulating housing by means of insert molding, as shown also in FIG. 4.

The insulating housing 25 has a protrusion 25a which comes into the plug connector 11 when the plug connector 11 is coupled with the receptacle connector 12. A plurality of conductive contacts 27 are arranged on the insulating housing 15. Each of the conductive contacts 27 is made of resilient conductive plate material to be shaped into a strip and provided, respectively at both end portions of the stripe, with a board connecting portion 27a to be connected with a circuit terminal provided on the upper surface of the circuit board 14 and a contact-connecting portion 27b operative to be put in contact with the conductive contact 16 provided on the plug connector 11 fixed to the lower surface of the circuit board 13. The board connecting portions 27a provided respectively on the conductive contacts 27 are arranged to project from the insulating housing 25 to the outside of the insulating housing 25 so as to be connected respectively with the circuit terminals provided on the upper surface of the circuit board 14 by means of, for example, soldering. The contact-connecting portions 27b provided respectively on the conductive contacts 27 are arranged along an inside wall surface and a top surface of the protrusion 25a provided on the insulating housing 25.

The holding metal members 26 are placed to face each other with the insulating housing 25 therebetween in a direction along which the conductive contacts 27 are arranged on the insulating housing 25. Each of the holding metal members 26 has a body portion 28 extending along the insulating housing 25 and a plurality of fixing portions 29 each projecting from the body portion 28 to be fixed to the upper surface of the circuit board 14. When the plug connector 11 is coupled with the receptacle connector 12, the strip-shaped portion 18 of the resilient shell member 17 provided on the plug connector 11 causes the inner surface portion thereof to come into contact with an outer surface portion of the body portion 28. Each of the fixing portions 29 is fixed to the upper surface of the circuit board 14 by means of, for example, soldering and thereby the receptacle connector 12 is fixed to the upper surface of the circuit board 14.

Under such a condition, when the lower surface of the circuit board 13 on which the plug connector 11 is mounted is caused to face to the upper surface of the circuit board 14 on which the receptacle connector 12 is mounted and then the circuit board 13 is closely laid on top of the circuit board 14, the plug connector 11 which is constituted with the first embodiment of circuit board connecting device according to the present invention is coupled with the receptacle connector 12 which is constituted with the mate connecting device.

On that occasion, under a situation wherein the circuit board 13 is so positioned as to cause the under surface on which the plug connector 11 is fixed to come closely to the upper surface of the circuit board 14 on which the receptacle connector 12 is fixed so that the circuit board 13 is closely laid on top of the circuit board 14, the insulating housing 15 of the plug connector 11 is fitted to the insulating housing 25 of the receptacle connector 12 in such a manner that the protrusion 25a provided on the insulating housing 25 of the receptacle connector 12 is inserted into the inside of the insulating housing 15 of the plug connector 11. As a result, the plug connector 11 accompanied with the circuit board 13 is put in connection-coupling with the receptacle connector 12 accompanied with the circuit board 14, as shown in FIG. 5 (the schematic perspective view in which the circuit board 13 is shown with imaginary lines), FIG. 6 (the schematic plan view in which the circuit board 13 and the circuit board 14 are omitted to be shown), FIG. 7 (the schematic side view in which the circuit board 13 and the circuit board 14 are omitted to be shown, and FIG. 8 (the schematic cross-sectional view taken along line VIII-VIII in FIG. 7).

Figure 8:
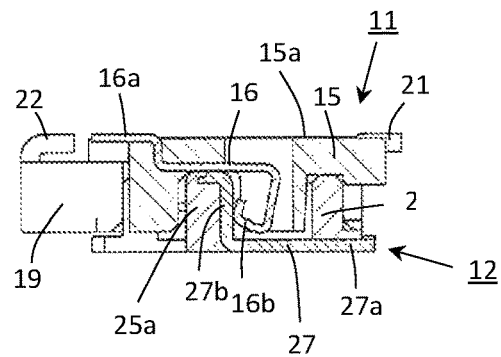
FIG. 8 is a schematic cross-sectional view taken along line VIII-VIII in FIG. 7.

Under a condition wherein the plug connector 11 is put in connection-coupling with the receptacle connector 12, as shown in FIG. 8, the contact-connecting portions 16b of each of the conductive contacts 16 arranged on the insulating housing 15 of the plug connector 11 is caused to come into contact with the contact-connecting portion 27b of a corresponding one of the conductive contacts 27 arranged along the inside wall surface and the top surface of the protrusion 25a provided on the insulating housing 25 of the receptacle connector 12 so that the conductive contacts 16 of the plug connector 11 are contact-connected respectively with the conductive contacts 27 of the receptacle connector 12. As a result, each of the circuit terminals provided on the circuit board 13, with which the board connecting portions 16a of the conductive contacts 16 are connected respectively, is linked, through the conductive contact 16 and the conductive contact 27, to a corresponding one of the circuit terminals provided on the circuit board 14, with which the board connecting portions 27a of the conductive contacts 27 are connected respectively, so that the circuit board 13 and the circuit board 14 are put in a condition of mutual electrical connection.

Figure 5:
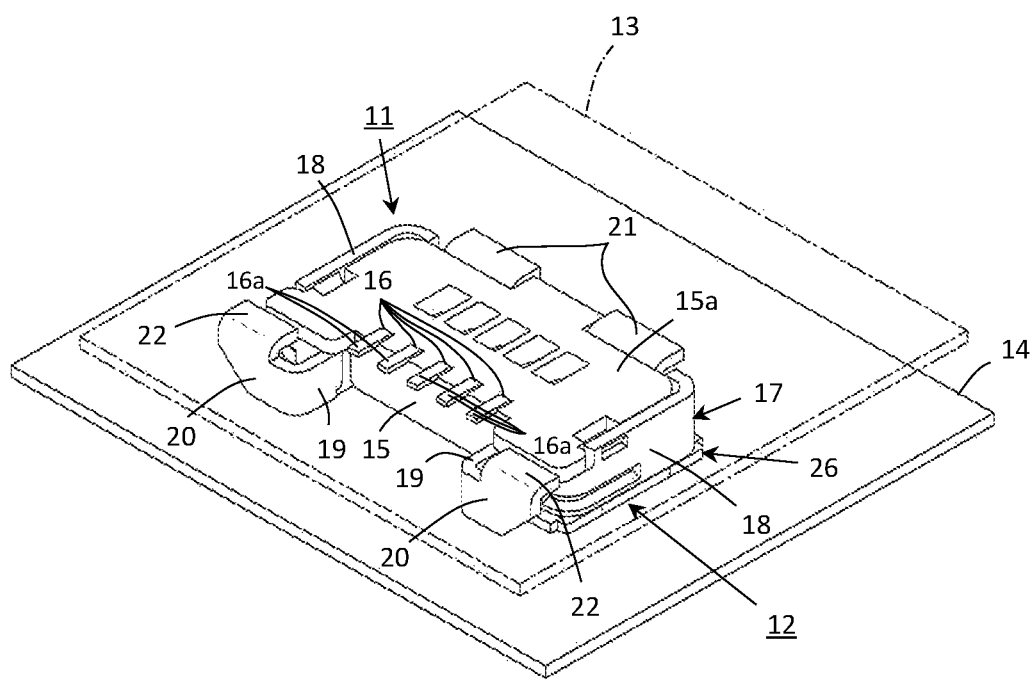
FIG. 5 is a schematic perspective view showing a condition wherein the plug connector accompanied with the first circuit board (shown by imaginary lines) as shown in FIG. 1 is coupled with the receptacle connector accompanied with the second circuit board as shown in FIG. 1.
Figure 6:
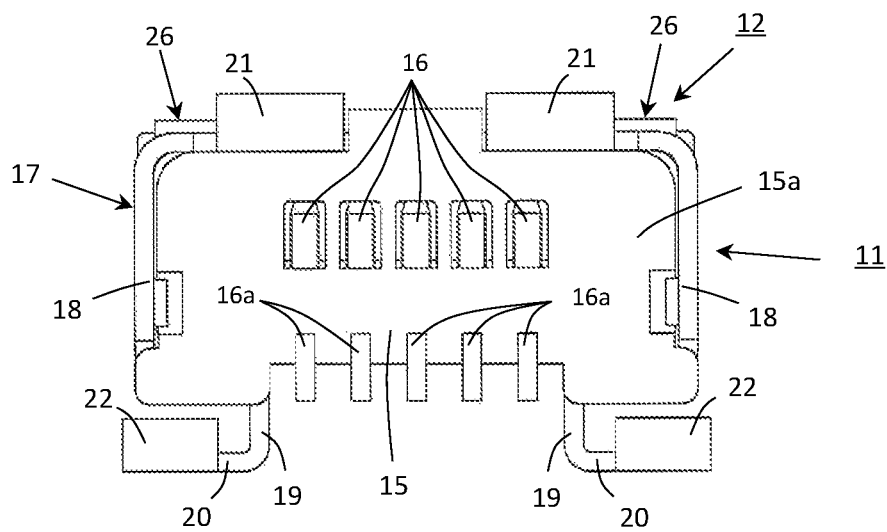
FIG. 6 is a schematic plan view showing a condition wherein the plug connector shown in FIG. 1 is coupled with the receptacle connector shown in FIG. 1.
Figure 7:
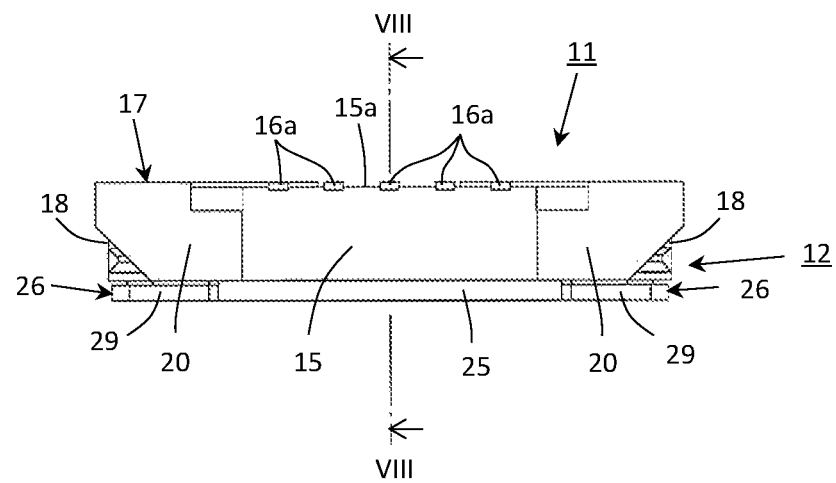
FIG. 7 is a schematic side view showing a condition wherein the plug connector shown in FIG. 1 is coupled with the receptacle connector shown in FIG. 1.

Further, when the plug connector 11 is put in connection-coupling with the receptacle connector 12, the strip-shaped portion 18 of the resilient shell member 17 provided on the plug connector 11, which extends along the board-facing surface portion 15a of the insulating housing 15, is operative to cause the inner surface portion thereof to come into resilient contact with the outer surface portion of the body portion 28 of the holding metal member 26 provided on the receptacle connector 12 so as to lock the plug connector 11 to the receptacle connector 12, as shown in FIGS. 5 and 6. Under such a condition, since the whole of the part of the part of the strip-shaped portion 18 between the first fixing portion 21 and the second fixing portion 22, the bent projecting portions 19 and the extending portions 20 constitute the spring member, a resilient pressing force by the spring member constituted with the whole of the strip-shaped portion 18 between the first fixing portion 21 and the second fixing portion 22, the bent projecting portions 19 and the extending portions 20, acts on the strip-shaped portion 18 so that the inner surface of the strip-shaped portion 18 is caused to contact resiliently with the outer surface portion of the body portion 28 of the holding metal member 26 provided on the receptacle connector 12. On that occasion, the bent projecting portion 19 elongating to be bent from the end portion of the strip-shaped portion 18 for projecting in the direction remote from the insulating housing 15 and the extending portion 20 extending further to be bent from the end portion of the bent projecting portion 19 so as to be opposite to the strip-shaped portion 18, are operative to enhance the resilient pressing force by the spring member acting on the strip-shaped portion 18.

Accordingly, in the plug connector 11 provided with the resilient shell member 17, the resilient shell member 17 is able to keep sufficient resiliency even under a situation wherein the resilient shell member 17 is reduced in its size in a direction perpendicular to the under surface of the circuit board 13 along with a reduction in thickness of the plug connector 11 as a whole for achieving low-profile, and in addition, is less susceptible to changes with time on the same. Therefore, with the plug connector 11, the strip-shaped portion 18 of the resilient shell member 17 on which the resilient pressing force by the spring member constituted with the whole of the part of the strip-shaped portion 18 between the first fixing portion 21 and the second fixing portion 22, the bent projecting portions 19 and the extending portions 20 acts, is able to cause surely and stably the inner surface portion thereof to come into resilient contact with the outer surface portion of the body portion 28 of the holding metal member 26 provided on the receptacle connector 12 even under the situation wherein the plug connector 11 as a whole is subjected to reduction in its thickness for achieving low-profile, so that the plug connector 11 is maintained properly and surely in connection-coupling with the receptacle connector 12.

Figure 9:
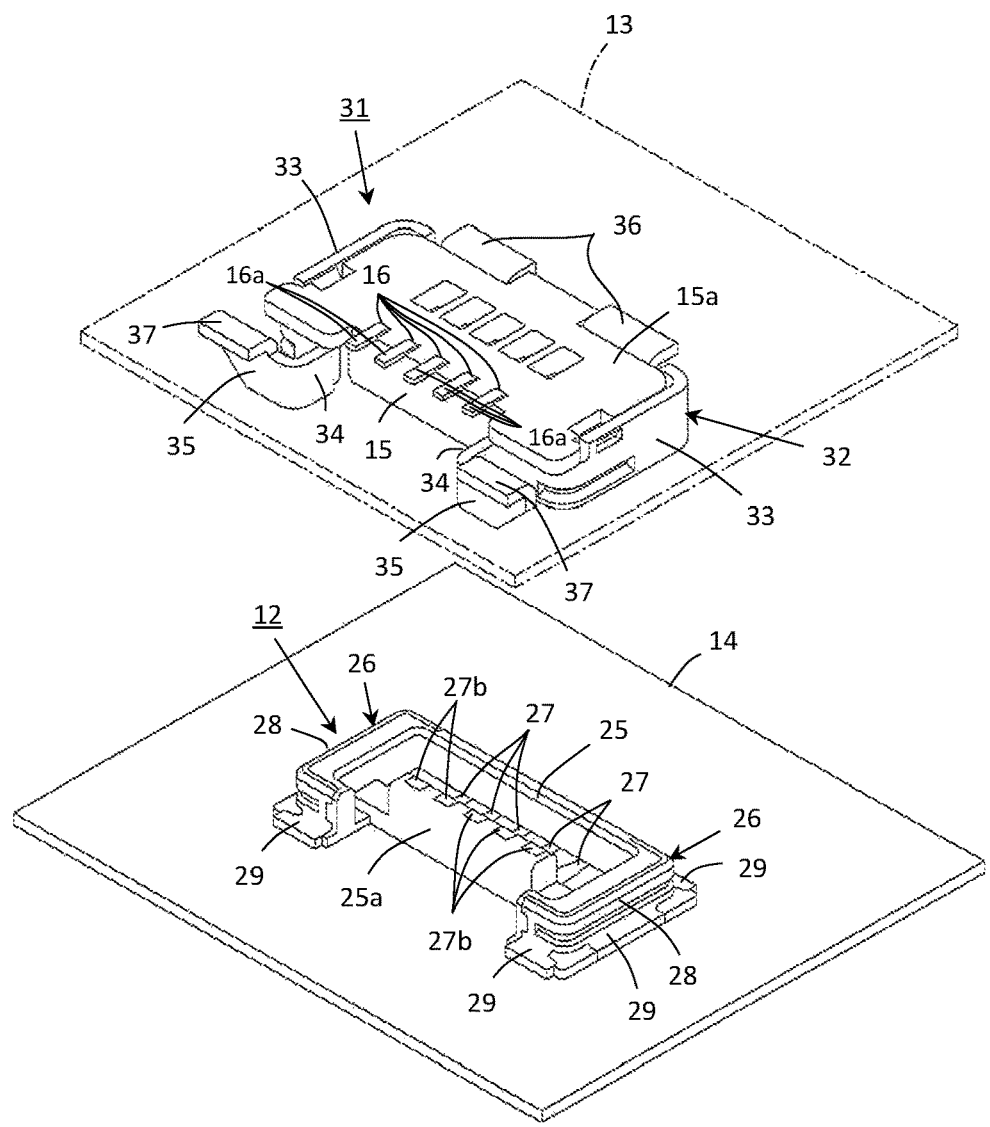
FIG. 9 is a schematic perspective view showing a second embodiment of circuit board connecting device according to the present invention which constitutes a plug connector, together with the first circuit board (shown by imaginary lines) on which the plug connector is mounted, and the mate connecting device which constitutes the receptacle connector with which the plug connector is to be coupled, together with the second circuit board on which the receptacle connector is mounted.

FIG. 9 shows a plug connector 31 which is constituted with a second embodiment of circuit board connecting device according to the present invention and mounted on a circuit board 13 which is same as the circuit board 13 explained above and shown by imaginary lines (dot-dash lines), and the receptacle connector 12 which is explained above and mounted on a circuit board 14 which is same as the circuit board 14 explained above. The plug connector 31 is fixed to the parts-mounting surface facing downward in FIG. 9, that is, the lower surface of the circuit board 13 and the receptacle connector 12 is fixed to the parts-mounting surface facing upward in FIG. 9, that is, the upper surface of the circuit board 14.

The plug connector 31 is provided with an insulating housing 15 made of insulator such as plastics or the like in the same manner as the insulating housing 15 of the plug connector 11 mentioned above and a plurality of conductive contacts 16, each of which is constituted in the same manner as the conductive contact 16 arranged on the insulating housing 15 of the plug connector 11, are arranged on the insulating housing 15.

Figure 10:
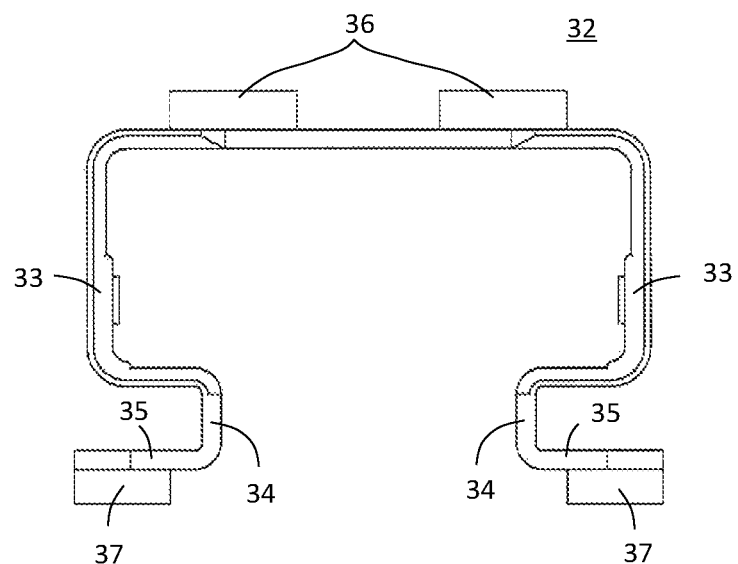
FIG. 10 is a schematic bottom view showing a resilient shell member provided to be employed in the plug connector shown in FIG. 9.

Further, a resilient shell member 32 is attached to the insulating housing 15 for engaging resiliently with the receptacle connector 12 when the plug connector 31 is coupled with the receptacle connector 12 so as to maintaining the plug connector 31 in coupling with the receptacle connector 12. As shown in FIG. 10, the resilient shell member 32 is made of resilient conductive plate material subjected to bending processing to include a strip-shaped portion 33 extending along a board-facing surface portion 15a of the insulating housing 15, a pair of bent projecting portions 34, each of which elongates to be bent from an end portion of the strip-shaped portion 33 for projecting in a direction remote from the insulating housing 15, and a pair of extending portions 35, each of which extends further to be bent from an end portion of the bent projecting portion 34 so as to be opposite to the strip-shaped portion 33.

The strip-shaped portion 33 is provided with a first fixing portion 36 to be fixed to the lower surface of the circuit board 13 and the extending portion 35 is provided with a second fixing portion 37 to be fixed to the lower surface of the circuit board 13. The whole of a part of the strip-shaped portion 33 between the first fixing portion 36 and the second fixing portion 37, the bent projecting portion 34 and the extending portion 35 constitutes a spring member. Under such a condition, the strip-shaped portion 33 is operative to cause an inner surface portion thereof to come into resilient contact with the outer surface portion of the receptacle connector 12 when the plug connector 31 is coupled with the receptacle connector 12.

In a more detailed explanation of the resilient shell member 32, the second fixing portion 37 provided on the extending portion 35 projects outwardly from the extending portion 35 so as to go away from the strip-shaped portion 33. The second fixing portion 37 provided thus on the extending portion 35 is able to be fixed more easily to the lower surface of the circuit board 13 by means of, for example, soldering. The first fixing portion 36 provided on the strip-shaped portion 33 and the second fixing portion 37 provided on the extending portion 35 are arranged to face each other with the insulating housing 15 therebetween. The resilient shell member 32 constitutes a single member with the strip-shaped portion 33 surrounding partially the board-facing surface portion 15a of the insulating housing 15. Both ends of the strip-shaped portion 33 face each other with a predetermined space therebetween and the bent projecting portion 34 extends to be bent from each of the ends of the strip-shaped portion 33. The board connecting portion 16a of each of the conductive contacts 16 arranged on the insulating housing 15 projects from the insulating housing 15 to the outside thereof in the space between the both ends of the strip-shaped portion 33 facing each other.

Although, in the plug connector 31 shown in FIGS. 9 and 10, the resilient shell member 32 constitutes the single member with the strip-shaped portion 33 surrounding partially the board-facing surface portion 15a of the insulating housing 15, it is not necessary for the resilient shell member 32 to be limited to such an example. For example, it is also possible that the resilient shell member 32 constitutes first and second shell components attached to the insulating housing 15 and each of the first and second shell components is provided with a part of the strip-shaped portion 33, the bent projecting portion 34 and the extending portion 35. In such a case, the part of the strip-shaped portion 33 of the first shell component and the strip-shaped portion 33 of the second shell component face each other with the board-facing surface portion 15a of the insulating housing 15 therebetween, the bent projecting portion 34 of the first shell component and the bent projecting portion 34 of the second shell component face each other with a predetermined space therebetween, and the extending portion 35 of the first shell component and the extending portion 35 of the second shell component face each other with a predetermined space therebetween. The board connecting portion 16a of each of the conductive contacts 16 arranged on the insulating housing 15 projects from the insulating housing 15 to the outside thereof in the space between the bent projecting portion 34 of the first shell component and the bent projecting portion 34 of the second shell component so as to be connected with the circuit terminal provided on the lower surface of the circuit board 13 be means of, for example, soldering.

Under such a condition, when the lower surface of the circuit board 13 on which the plug connector 31 is mounted is caused to face to the upper surface of the circuit board 14 on which the receptacle connector 12 is mounted and then the circuit board 13 is closely laid on top of the circuit board 14, the plug connector 31 which is constituted with the second embodiment of circuit board connecting device according to the present invention is coupled with the receptacle connector 12 which is constituted with the mate connecting device.

On that occasion, under a situation wherein the circuit board 13 is so positioned as to cause the under surface on which the plug connector 31 is fixed to come closely to the upper surface of the circuit board 14 on which the receptacle connector 12 is fixed so that the circuit board 13 is closely laid on top of the circuit board 14, the insulating housing 15 of the plug connector 31 is fitted to the insulating housing 25 of the receptacle connector 12 in such a manner that the protrusion 25a provided on the insulating housing 25 of the receptacle connector 12 is inserted into the inside of the insulating housing 15 of the plug connector 31. As a result, the plug connector 31 accompanied with the circuit board 13 is put in connection-coupling with the receptacle connector 12 accompanied with the circuit board 14, as shown in FIG. 11 (the schematic perspective view in which the circuit board 13 is shown with imaginary lines) and FIG. 12 (the schematic plan view in which the circuit board 13 and the circuit board 14 are omitted to be shown.

Under a condition wherein the plug connector 31 is put in connection-coupling with the receptacle connector 12, the contact-connecting portions 16b of each of the conductive contacts 16 arranged on the insulating housing 15 of the plug connector 31 is caused to come into contact with the contact-connecting portion 27b of a corresponding one of the conductive contacts 27 arranged along the inside wall surface and the top surface of the protrusion 25a provided on the insulating housing 25 of the receptacle connector 12 so that the conductive contacts 16 of the plug connector 31 are contact-connected respectively with the conductive contacts 27 of the receptacle connector 12. As a result, each of the circuit terminals provided on the circuit board 13 with which the board connecting portion 16a of each of the conductive contacts 16 is connected is linked, through the conductive contact 16 and the conductive contact 27, to a corresponding one of the circuit terminals provided on the circuit board 14 with which the board connecting portion 27a of each of the conductive contacts 27 is connected, so that the circuit board 13 and the circuit board 14 are put in a condition of mutual electrical connection.

Figure 11:
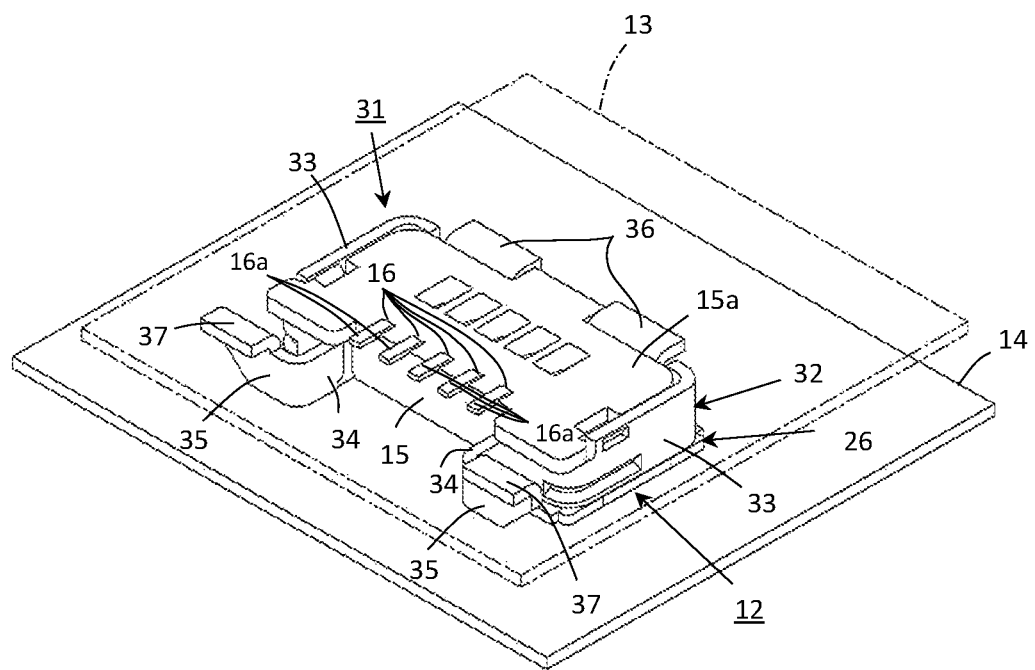
FIG. 11 is a schematic perspective view showing a condition wherein the plug connector accompanied with the first circuit board (shown by imaginary lines) as shown in FIG. 9 is coupled with the receptacle connector accompanied with the second circuit board as shown in FIG. 9.
Figure 12:
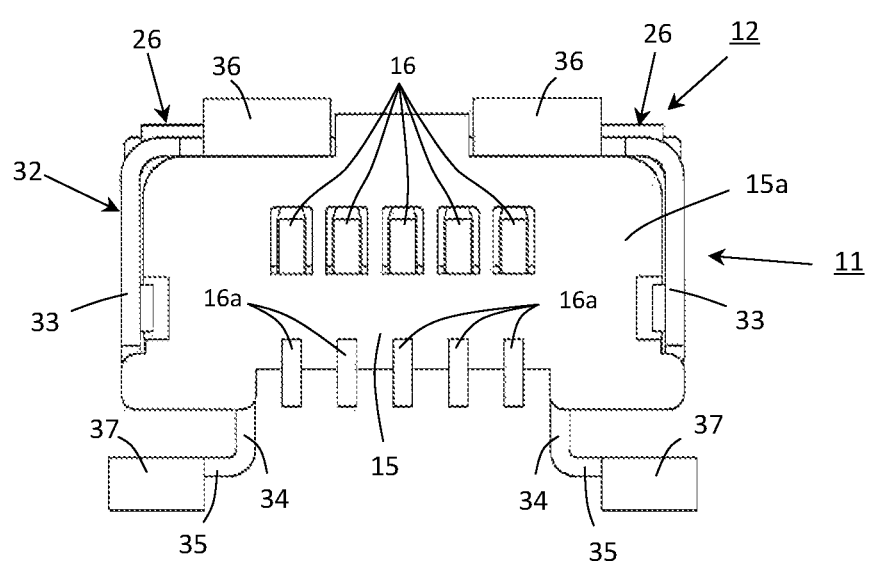
FIG. 12 is a schematic plan view showing a condition wherein the plug connector shown in FIG. 9 is coupled with the receptacle connector shown in FIG. 9.

Further, when the plug connector 31 is put in connection-coupling with the receptacle connector 12, the strip-shaped portion 33 of the resilient shell member 32 provided on the plug connector 31, which extends along the board-facing surface portion 15a of the insulating housing 15, is operative to cause the inner surface portion thereof to come into resilient contact with the outer surface portion of the body portion 28 of the holding metal member 26 provided on the receptacle connector 12 so as to lock the plug connector 31 to the receptacle connector 12, as shown in FIGS. 11 and 12. Under such a condition, since the whole of the part of the strip-shaped portion 33 between the first fixing portion 36 and the second fixing portion 37, the bent projecting portions 34 and the extending portions 35 constitute the spring member, a resilient pressing force by the spring member constituted with the whole of the part of the strip-shaped portion 33 between the first fixing portion 36 and the second fixing portion 37, the bent projecting portions 34 and the extending portions 35, acts on the strip-shaped portion 33 so that the inner surface of the strip-shaped portion 33 is caused to contact resiliently with the outer surface portion of the body portion 28 of the holding metal member 26 provided on the receptacle connector 12. On that occasion, the bent projecting portion 34 elongating to be bent from the end portion of the strip-shaped portion 33 for projecting in the direction remote from the insulating housing 15 and the extending portion 35 extending further to be bent from the end portion of the bent projecting portion 34 so as to be opposite to the strip-shaped portion 33, are operative to enhance the resilient pressing force by the spring member acting on the strip-shaped portion 33.

Accordingly, with the plug connector 31 constituted to have the resilient shell member 32 as described above, the same operational effects as those obtained with the plug connector 11 are able to obtained.

The invention claimed is:

1. A circuit board connecting device comprising;
   an insulating housing shaped into a plate-like member having a board-facing surface portion for facing with a parts-mounting surface on a first circuit board,
   a plurality of conductive contacts arranged on the insulating housing, each of said conductive contact being provided with a board connecting portion to be connected with the parts-mounting surface of the first circuit board and a contact-connecting portion operative to be put in contact with a mate conductive contact provided on a mate connecting device mounted on a second circuit board, and
   a resilient shell member attached to the insulating housing for engaging resiliently with the mate connecting device when the circuit board connecting device is coupled with the mate connecting device so as to maintaining the circuit board connecting device in coupling with the mate connecting device,
   wherein the resilient shell member includes a strip-shaped portion provided with a first fixing portion to be fixed to the parts-mounting surface of the first circuit board and surrounding partially the board-facing surface portion of the insulating housing so as to cause an inner surface portion thereof to come into resilient contact with an outer surface portion of the mate connecting device, a pair of bent projecting portions, each of said bent projecting portions elongating to be bent from an end portion of the strip-shaped portion for projecting in a direction remote from the insulating housing and a pair of extending portions, each of said extending portions being provided with a second fixing portion to be fixed to the parts-mounting surface of the first circuit board and extends further to be bent from an end portion of the bent projecting portion so as to be opposite to the strip-shaped portion, and the strip-shaped portion between the first and second fixing portions, the bent projecting portions and the extending portions constitute a spring member.

2. A circuit board connecting device according to claim 1, wherein the second fixing portion provided on the extending portion of the resilient shell member projects from the extending portion so as to position away from the strip-shaped portion of the resilient shell member.

3. A circuit board connecting device according to claim 1, wherein the second fixing portion provided on the extending portion of the resilient shell member projects from the extending portion so as to come close to the strip-shaped portion of the resilient shell member.

4. A circuit board connecting device according to claim 1, wherein the first fixing portion provided on the strip-shaped portion of the resilient shell member and the second fixing portion provided on the extending portion of the resilient shell member are arranged to face each other with the insulating housing therebetween.

5. A circuit board connecting device according to claim 1, wherein the resilient shell member constitutes a single member with the strip-shaped portion surrounding partially the board-facing surface portion of the insulating housing, both ends of the strip-shaped portion face each other with a predetermined space therebetween and the bent projecting portion extends to be bent from each of the both ends of the strip-shaped portion.

6. A circuit board connecting device according to claim 5, wherein the board connecting portion of each of the conductive contacts arranged on the insulating housing projects from the insulating housing to the outside thereof in the space between the both ends of the strip-shaped portion facing each other.

7. A circuit board connecting device according to claim 1, wherein the resilient shell member constitutes first and second shell components attached to the insulating housing and each of the first and second shell components is provided with a part of the strip-shaped portion and the bent projecting portion and the extending portion, wherein the part of the strip-shaped portion of the first shell component and the part of the strip-shaped portion of the second shell component face each other with the board-facing surface portion of the insulating housing therebetween, the bent projecting portion of the first shell component and the bent projecting portion of the second shell component face each other with a predetermined space therebetween, and the extending portion of the first shell component and the extending portion of the second shell component face each other with a predetermined space therebetween.

8. A circuit board connecting device according to claim 7, wherein the board connecting portion of each of the conductive contacts arranged on the insulating housing projects from the insulating housing to the outside thereof in the space between the bent projecting portion of the first shell component and the bent projecting portion of the second shell component.

* * * * *